United States Patent
Moreau

[11] Patent Number: 5,481,132
[45] Date of Patent: Jan. 2, 1996

[54] TRANSISTOR WITH A PREDETERMINED CURRENT GAIN IN A BIPOLAR INTEGRATED CIRCUIT

[75] Inventor: Jean-Michel Moreau, Grenoble, France

[73] Assignee: SGS-Thomson Microelectronics S.A., Gentilly, France

[21] Appl. No.: 154,379

[22] Filed: Nov. 18, 1993

Related U.S. Application Data

[63] Continuation of Ser. No. 889,917, May 29, 1992, abandoned.

[30] Foreign Application Priority Data

May 31, 1991 [FR] France .................... 91 06896

[51] Int. Cl.⁶ .................................................. H01L 29/72
[52] U.S. Cl. ..................... 257/566; 257/565; 257/568; 257/569; 257/570; 257/574; 257/575; 257/577; 257/579; 257/587; 257/588; 257/592
[58] Field of Search ........................ 257/568, 569, 257/565, 566, 570, 574, 575, 579, 577, 587, 588, 592

[56] References Cited

U.S. PATENT DOCUMENTS

| | | | |
|---|---|---|---|
| 3,393,349 | 7/1968 | Huffman | 257/566 |
| 3,504,203 | 3/1970 | Haines | 257/566 |
| 3,573,573 | 4/1971 | Moore | 317/23.5 |
| 3,628,069 | 12/1971 | Najmann | 307/303 |
| 3,770,519 | 11/1973 | Wiedmann | |
| 3,810,123 | 5/1974 | Baitinger et al. | |
| 4,258,379 | 3/1981 | Watanabe et al. | 257/566 |

FOREIGN PATENT DOCUMENTS

| | | |
|---|---|---|
| 57-106160 | 7/1982 | Japan . |
| 1502122 | 2/1978 | United Kingdom . |

OTHER PUBLICATIONS

"Integrated NPN Transistors with Different Current Gains", R. C. Wong, IBM Technical Disclosure Bulletin vol. 27, No. 1A, Jun. 1984, pp. 234–236.

*Primary Examiner*—Rolf Hille
*Assistant Examiner*—Valencia Martin Wallace
*Attorney, Agent, or Firm*—Lowe, Price, LeBlanc & Becker

[57] ABSTRACT

A bipolar integrated circuit with N-type wells (2) formed in a P-type substrate (1) includes in first wells, first transistors (EBC), the well of which constitutes the collector. P-type base region (7a) is formed in the first well with an N+ emitter region (8) formed in the base region. In at least a second well forming a collector, a composite second transistor (E'B'C') is constituted by an elemental third transistor ($E_1B_1C'$) comprising regions of the same doping level as the first transistor and an elemental fourth transistor ($E_2B_2C'$) having a base region (11) with a high doping level with respect to that of the bases of the first transistor. Emitter regions (8b, 12) of the elemental transistors are of the same doping level as that of the first transistors. The emitters and bases of the third and fourth elementary transistors are interconnected and constitute the emitter and the base of the composite second transistor.

20 Claims, 2 Drawing Sheets

TRANSISTOR WITH A PREDETERMINED CURRENT GAIN IN A BIPOLAR INTEGRATED CIRCUIT

This application is a continuation of application Ser. No. 07/889,917 filed May 29, 1992, now abandoned.

TECHNICAL FIELD

The invention relates generally to bipolar integrated circuits and, more particularly, to a composite bipolar transistor having a gain which is a precise proportion of a gain of a second transistor.

BACKGROUND ART

Integrated circuits conventionally include a large number of identically formed components configured and assembled to form the various individual circuits constituting a particular integrated circuit. Only a limited variety of component types are needed and used to form the required circuits. Because all components of a particular type are commonly and simultaneously formed, the characteristics of all components of a particular type are uniform; there is little variation between components of a particular type.

Because all like type components are simultaneously formed, processing variations affect all such components equally, thereby minimizing differences in operating characteristics among components of a particular type. For example, all NPN transistors required to have a first predetermined threshold are simultaneously formed at different substrate locations, thereby minimizing variations in the operating characteristics of those NPN transistors.

One or more steps of the manufacturing process are altered to produce different types of components. While operating characteristics vary little among the same type of component, normal processing variations make it difficult to insure a consistent relationship between different types of components. For example, it is difficult to ensure a consistent relationship between the thresholds of two different types of transistors due to processing variations. These variations include slight differences in doping levels and diffusion depths caused by variations in annealing conditions.

FIG. 1 is a sectional view of a basic component of a conventional bipolar type of integrated circuit. Junction isolation is provided between components formed in the P-type substrate by forming the components in N-type wells.

The integrated circuit is formed on a single-crystal P-type silicon semiconductor substrate 1. In the conventional integrated circuit, a P-type first conductivity type semiconductor material and an opposite, N-type second conductivity semiconductor material form the NPN transistor shown. A corresponding PNP device can be formed by using an N-type first conductivity material and P-type second conductivity material.

As shown, an opposite conductivity N type layer is formed not always in the substrate, for example, by epitaxial growth. The N-type layer is divided into separate wells 2 by deep diffusion of a P-type impurity from the upper surface of the substrate at predetermined locations 3. Conventionally, the bottom of the well comprises a highly doped buried region 4 of the second N-type conductivity.

Well 2 constitutes a collector region of the NPN transistor, with a collector contact C formed on a surface of an over-doped region 6 of well 2. A P-type well region 7 is formed in well 2 by implanting or diffusing a P-type impurity through a surface region of substrate 1 laterally spaced from over-doped region 6. The P-type well region 7 constitutes a base region of the transistor with a base contact B formed on a surface of region 7. An $N^+$ emitter region 8 is formed in P-type well region 7, laterally spaced from base contact B. An emitter metallization E is formed on a surface of emitter region 8.

The operating characteristics of the NPN transistor of FIG. 1 are determined by a combination of physical properties of the device including the impurity doping levels, junction depths and concentrations gradients of the emitter-base and base-collector junctions. In particular, the current gain and the breakdown voltage $BV_{CEO}$ are among the operating characteristics affected by the listed physical properties of the device.

Conventionally, the doping level of the base or emitter region of a device is varied to manufacture a second NPN transistor having a current gain different from that of the transistor shown in FIG. 1. However, because this second transistor is manufactured by different processing steps, the relative gain of the second transistor with respect to the first transistor among different manufacturing batches will not be consistent so that it is not possible to precisely obtain a predetermined ratio of transistor gains.

U.S. Pat. No. 3,770,519 assigned to IBM and UK Patent 1,502,122 assigned to RCA disclose NPN transistors having predetermined different physical properties to achieve corresponding different operating characteristics. In the IBM patent, a normal first transistor and a second transistor having a relatively very low current gain are formed in a common well. The very low gain transistor is operated as a diode with an anode connected to the base of the first transistor. However, the prior art fails to describe a composite transistor formed of two elementary interconnected transistors whereby the composite transistor has a predetermined gain relative to a conventional transistor formed in the same substrate.

SUMMARY OF THE INVENTION

An object of the invention is to provide an integrated circuit and method of manufacturing thereof including first and second bipolar transistors having a predetermined gain ratio defined by structure which is tolerant of manufacturing variations and temperature parameters.

Another object of the invention is to provide a bipolar transistor having a predetermined gain relative to a second transistor that is not substantially affected by variations in doping levels and other manufacturing sensitive parameters.

Another object of the invention is to provide two transistors having different current gains using simultaneously performed processing steps whereby variations in the processing steps equally affect the thresholds of the transistors.

According to one aspect of the invention, a composite transistor structure includes two elemental transistors formed in a common well; a first elemental bipolar transistor and a gain controlling second elemental bipolar transistor having a very highly doped base. The bases and emitters of the two elemental transistors are interconnected. To achieve an overall current gain of 1/k+1 with respect to a "normal" transistor, the gain controlling elemental transistor is formed having an emitter surface k times that of the other elemental transistor.

The foregoing and other objects, features, aspects and advantages of the invention will become more apparent from the following detailed description of the present invention when taken in conjunction with the accompanying drawings.

BEST MODE FOR CARRYING OUT THE INVENTION

Figure 1:
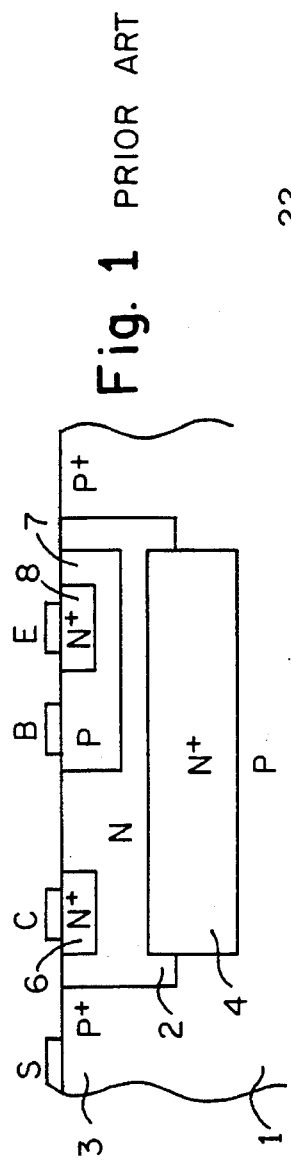
FIG. 1 is a representative cross-sectional view of the structure of a conventional NPN transistor in a bipolar integrated circuit formed in junction isolated wells.
Figure 2:
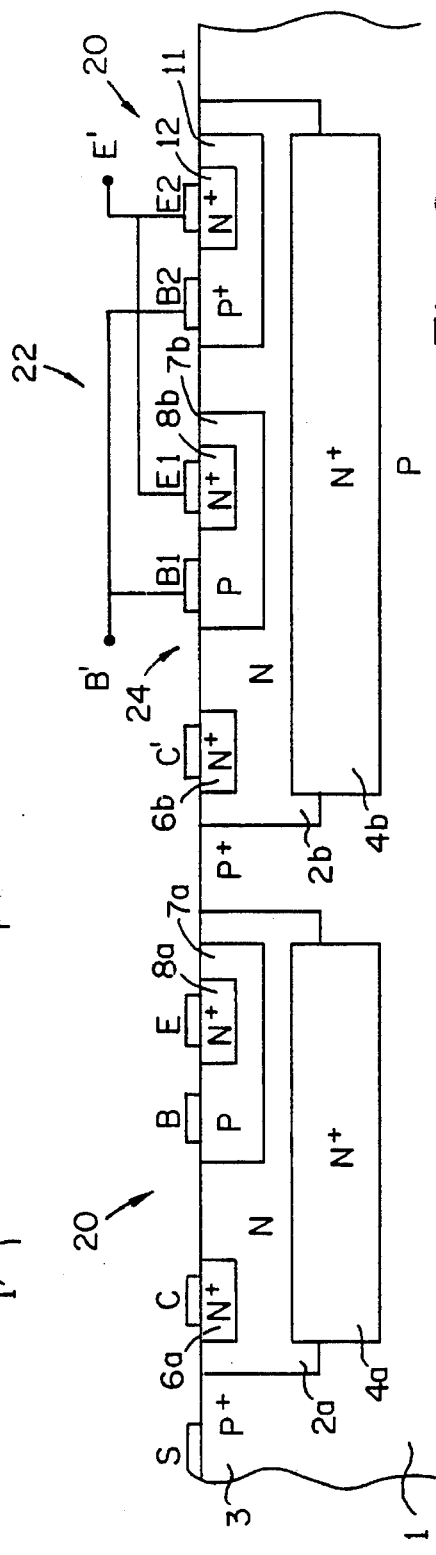
FIG. 2 is a cross-sectional view of a first embodiment of the invention.
Figure 3:
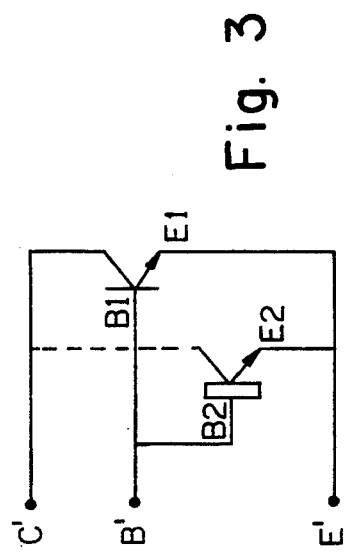
FIG. 3 is an electrical schematic diagram of an adjustable gain transistor according to the invention.

FIG. 2 is an idealized cross-sectional diagram of a bipolar integrated circuit including a conventional "normal" NPN transistor 20 formed spaced apart from composite transistor 22 in a common substrate 1. Normal transistor 20, as previously described with reference to FIG. 1 of the drawings, includes an N-type well region 2a formed in P-type substrate 1. A P-type sub-well 7a constituting a base region of normal transistor 20 is formed in a portion of well 2a. An N+−type emitter region 8a is formed in a portion of base region 7a. Well region 2a forms the collector of transistor 20 with an over-doped N+−type collector contact area 6a formed on the surface of substrate 1 spaced apart from base region 7a. An N+−type buried region 4 is formed in the bottom of well 2a. Wells 2a and 2b are separated by an intervening highly doped P+−type region near the surface of substrate 1.

Composite transistor 22 comprises a first elemental NPN transistor 24 and a second elemental NPN transistor 26 formed in a common N-type well 2b constituting the common collector region of the elemental transistors. The structure of elemental transistor 24 is the same as transistor 20. Thus elemental transistor 24 includes P-type base region 7b formed in a portion of N-type well 2b and N+−type emitter region 8b is formed in a portion of base region 7b. Base region 7b has the same impurity type and concentration as P-type region 7a. Emitter 8b, together with over-doped collector contact region 6b are of the same N conductivity type as well 2b but have higher doping concentrations.

Second elemental transistor 26 is formed in another portion of well 2b and includes P+−type base region 11 and N+−type emitter region 12 formed in base region 11. Base region 11 is of the same conductivity type as the substrate but is more highly doped than base region 7b of first elemental transistor 24. Emitter region 12 of second elemental transistor 26 is of the same conductivity type and doping level as emitter regions 8a and 8b of normal transistor 20 and first elemental transistor 24. A buried N+−type region 4b is formed in the bottom of well 2b, having the same conductivity as, but more highly doped than, well 2b.

First and second elemental transistors 24 and 26 are connected in parallel. In particular, bases B1 and B2 are interconnected, either externally or by a metallization layer formed on the substrate, to form base B' of composite transistor 22. Similarly, emitters E1 and E2 are interconnected to form emitter E' of the composite transistor 22. Emitter region 12 of second elemental transistor 26 has a surface area in contact with base region 11 which is k times the surface area of emitter region 8b in contact with base region 7b of first elemental transistor 24. However, because this ratio is approximately equal to the ratio between the respective surface areas of the emitter regions, it is sufficient to use this latter ratio for purposes of computing the gain of composite transistor 22, as is described hereinafter.

When a voltage $V_{BE}$ is applied between the base and emitter of a transistor, two carrier flows are generated. The emitter injects a carrier flow into the base which is inversely proportional to the Gummel number of the base. The Gummel number is the number of doping atoms introduced per surface unit into each region of the transistor. In transistors having conventional doping levels such as transistor 20, substantially all of the carriers pass through the base and therefore constitute the collector current of the transistor. Conversely, the base injects a carrier flow into the emitter which is inversely proportional to the Gummel number of the emitter. These carriers constitute substantially all of the base current.

The current gain of a transistor is equal to the ratio between the collector current and the base current. Therefore, the current gain of a transistor can be computed as the ratio between the Gummel numbers of the emitter and the base. If the Gummel number of the emitter is substantially greater than that of the base, the transistor will have a high current gain. This explanation is only a first approximation. In practice, the gain of a transistor is not equal to but is instead directly proportional to the ratio between the Gummel numbers. The proportionality factor is a constant when, as in the invention, the emitter doping level is the same for all the transistors considered.

Referring again to FIG. 2, if second elemental transistor 26 has an emitter with the same surface area as first elemental transistor 24, the elemental transistors will have equal base currents when the same base-emitter voltage is applied. This is because the Gummel numbers of the emitters of both elemental transistors are equal. However, because the Gummel number of base region 11 of second elemental transistor 26 is very high due to over-doping of base region 11, the collector current will be relatively low. This results in a very low current gain for second elemental transistor 26.

With a base current of $I_B$ supplied to base terminal B' of composite transistor 22, the total base current will be equally distributed among elemental transistors 24 and 26, the emitters of which have the same Gummel number. Thus, elemental transistor 24, having a base current $I_{B2}$ will have a corresponding collector current which is one-half of the value absent elemental transistor 26. Because the collector current of elemental transistor 26 is substantially zero, the current gain of composite transistor 22 is halved in comparison with transistor 20. More generally, if the ratio between the surface areas of emitter regions 8b and 12 is equal to k, the gain of composite transistor 22 will be equal to 1/k+1 times the gain of transistor 20.

As explained, the composite transistor has a gain which is predetermined with respect to that of a "normal" transistor, the gain being established by the ratio between the surface areas of the emitter regions forming the composite transistor. Since the surface area of the emitter regions can be accurately and precisely adjusted during fabrication of the integrated circuit, the corresponding gain of the composite transistor can be accurately and precisely set with respect to the gain of the normal transistor. That is, because the normal and composite transistors are formed during the same processing steps and that it is not necessary to adjust the impurity concentration levels to vary the relative gains of the different transistors the desired gain ratio can be precisely and accurately achieved. The relative gains of the normal and composite transistors are only dependent on the ratio between the surface areas of the elemental transistors forming the composite transistor, given that the first elemental transistor is identically formed with the normal transistor.

Figure 4:
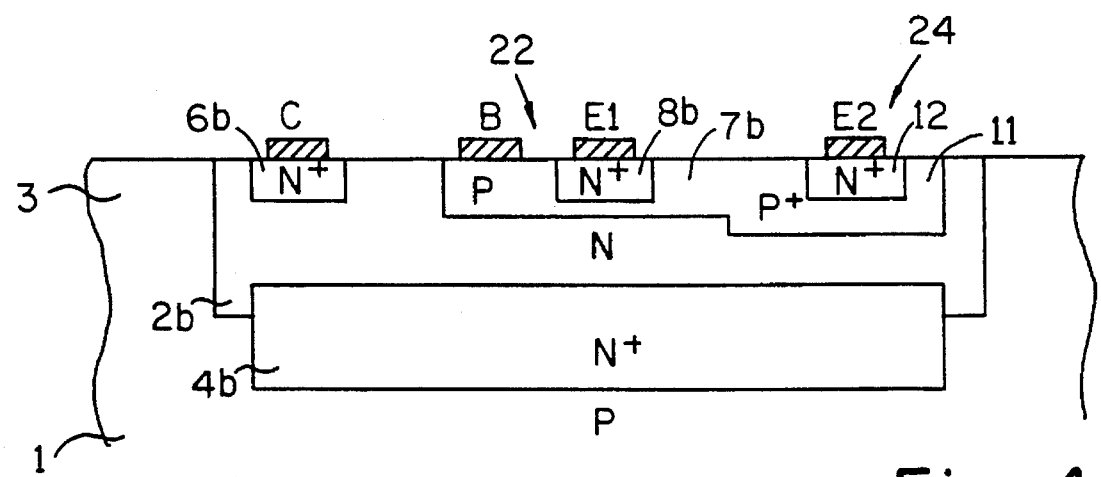
FIG. 4 is a cross-sectional view of a second embodiment of the invention.
Figure 5:
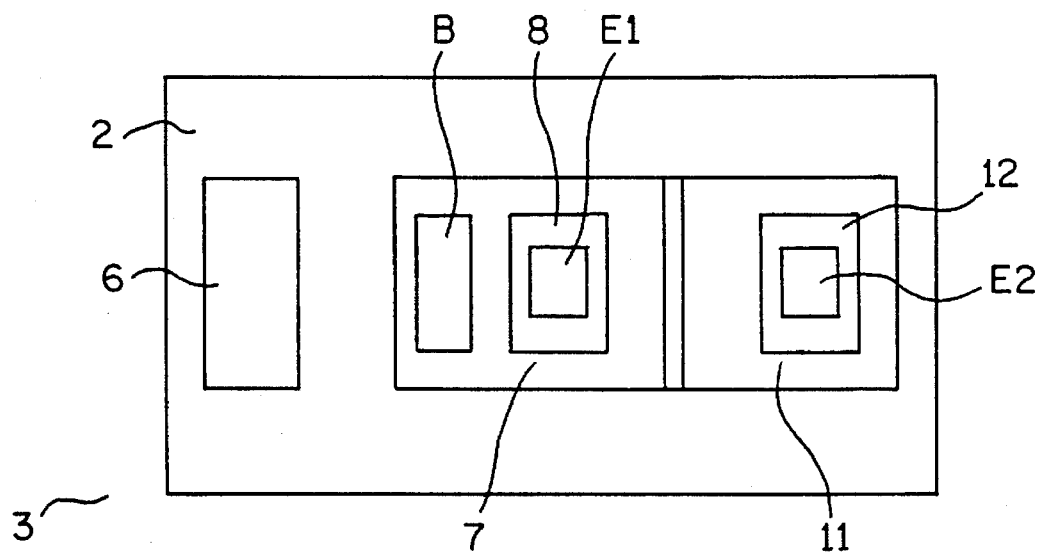
FIG. 5 is a top plan view of the embodiment of the invention shown in FIG. 4. Note that in FIGS. 1, 2, 4 and 5, the layers depicted are not drawn to scale and the shapes as shown are idealized representations.

FIGS. 4 and 5 are cross-sectional and top views, respectively, of a second embodiment of the invention. In particular, base region 7b of first elemental transistor 24 and base region 11 of second elemental transistor 26 are contiguous, i.e., immediately adjacent. The base regions are not separated by the N-type material forming well region 2b as in the first embodiment. According to the embodiments of the invention shown, typical doping levels or resistance values (r) in ohms per square and junction depths (x) given in μm are as follows:

| | |
|---|---|
| N-type collector 2: | $2.10^{15}$ at/cm3 |
| P-type base 7 (outside emitter region): | r = 130, x = 3 |
| P$^+$-type base 11 (outside emitter region): | r = 10, x = 6–15 |
| N+-type emitters 8 and 12: | r = 5, x = 2.8 |

Given these typical values, first elemental transistor 24 has a gain ranging from 50 to 500 and elemental transistor 26 has a gain less than 0.1. The ratio between the amounts of impurity in basis 11 and 8b is approximately 1,000.

In summary, the invention provides a new type of bipolar component constituting a transistor having a predetermined and adjustable gain with respect to other transistors forming the circuit.

Of course, the invention is liable to conventional variations which will be apparent to those skilled in the art. In particular, typical improvements applied to bipolar transistors can be incorporated into the invention. For example, while only conventional bipolar structures with junction-isolated wells have been described, the invention equally applies to dielectrically isolated wells.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A bipolar integrated circuit with wells of a first conductivity type, formed in a substrate of a second conductivity type, comprising:
   in a first well, a first transistor, said first well forming a collector region of said first transistor and having formed therein a base region of the second conductivity type, said base region having formed therein an emitter region of the first conductivity type; and
   in a second well, a composite second transistor, said second well forming a collector region of said composite transistor, said composite second transistor including
   (i) a first elemental transistor comprising emitter and base regions formed in said second well and having doping levels equal to respective doping levels of said base and emitter regions of said first transistor, and
   (ii) a second elemental transistor formed in said second well and including a base region having a doping level higher than a doping level of said base region of said first elemental transistor and an emitter region having a doping level substantially equal to said doping level of said emitter region of said first transistor,
   the emitters and bases of the first and second elemental transistors being respectively interconnected to form emitter and base regions of said composite second transistor.

2. The bipolar integrated circuit according to claim 1, wherein said first well and said second well are junction isolated, a bottom of said first well and second well comprising a buried layer of said first conductivity type with a doping level higher than a doping level of said respective first and second wells.

3. The bipolar integrated circuit according to claim 1, wherein the base of said second elemental transistor has an impurity concentration at least one thousand times an impurity concentration of said base of said first elemental transistor.

4. The bipolar integrated circuit according to claim 1, wherein the bases of said first and second elemental transistors are immediately adjacent.

5. A bipolar integrated circuit formed on a substrate and comprising:
   first and second wells formed isolated from each other in said substrate;
   a first bipolar transistor formed in said first well, said first well including a collector of said first transistor;
   a second bipolar transistor formed in said second well, said second well including a collector for said second bipolar transistor, said second bipolar transistor including parallel connected first and second elemental transistors formed in said second well, said first elemental transistor formed substantially identical to said first transistor, said second elemental transistor having a base more highly doped than a base region of said first elemental transistor and an emitter having a doping level substantially equal to an emitter doping level of said first transistor, an emitter surface area of said second elemental transistor being k times larger than a surface area of said emitter of said first elemental transistor where k is a real number, said second bipolar transistor having a current gain equal to 1/(k+1) times a current gain of said first bipolar transistor.

6. The bipolar integrated circuit according to claim 5, wherein said first well and said second well are junction isolated, a bottom of said first and second wells comprising buried layers of a first conductivity type with a doping level higher than a doping level of said first well and said second well.

7. The bipolar integrated circuit according to claim 5, wherein the base of said second elemental transistor has an impurity concentration one thousand times an impurity concentration of said base of said first transistor.

8. The bipolar integrated circuit according to claim 5, wherein the bases of said first and second elemental transistors are immediately adjacent.

9. A bipolar integrated circuit having a substrate of a first conductivity type and a composite transistor formed in a first main well of a second conductivity type formed in said substrate, said composite transistor comprising:
   a first elemental transistor including:
   (i) a collector region comprising said first main well,
   (ii) a base region comprising a first sub-well of said first conductivity type formed in said first main well, and (iii) an emitter region comprising a first emitter impurity region of said second conductivity type and having an impurity concentration higher than an impurity concentration of said first main well; and a second elemental transistor including:
 (i) a collector region comprising said first main well,
 (ii) a base region comprising a second sub-well of said first conductivity type formed spaced from said first sub-well in said first main well and having an impurity concentration higher than said first sub-well, and
 (iii) an emitter region comprising an impurity region of said second conductivity type having an impurity concentration greater than an impurity concentration of said first main well, said emitter region formed in said second sub-well and having an impurity concentration substantially equal to an impurity concentration of said emitter region of said first elemental transistor;

a collector terminal connected to said collector regions of said first and second elemental transistors;

a base terminal connected in common to said base regions of said first and second elemental transistors; and an emitter terminal connected in common to said emitter regions of said first and second elemental transistors.

10. The bipolar integrated circuit according to claim 9, further comprising a collector contact region of said second conductivity type formed in said first main well spaced from said base regions of said first and second elemental transistors, said collector contact region having an impurity concentration higher than an impurity concentration of said first main well.

11. The bipolar integrated circuit according to claim 9, further including a third transistor formed in a second main well formed in said substrate spaced from said first main well and having the same doping level as said first well, said third transistor including a collector region comprising said second main well;

a base region comprising a first sub-well of said first conductivity type formed spaced from said collector contact region in said second main well and having the same doping level as the base region of said first elemental transistor; and an emitter region comprising a first emitter impurity region of said second conductivity type and having an impurity concentration higher than said impurity concentration of said second main well.

12. The bipolar integrated circuit according to claim 11, said third transistor further comprising a collector contact region of said second conductivity type formed in said second main well and having an impurity concentration higher than an impurity concentration of said second main well.

13. The bipolar integrated circuit according to claim 11, wherein said first and second main wells are junction isolated, a bottom of said first and second wells comprising a buried layer of said first conductivity type with a doping level higher than a doping level of said respective first and second wells.

14. The bipolar integrated circuit according to claim 11, wherein the base region of said second elemental transistor has an impurity concentration one thousand times an impurity concentration of said base of said normal transistor.

15. The bipolar integrated circuit according to claim 10, wherein the base regions of said first and second elemental transistors are immediately adjacent.

16. The bipolar integrated circuit according to claim 10, wherein a surface area of said emitter region of said second elemental transistor is k times a surface area of said emitter region of said first elemental transistor where k is a real number, whereby said composite transistor has a gain equal to $1/(k+1)$ times a gain of said third transistor.

17. A bipolar integrated circuit having first and second transistor devices formed in respective first and second wells of a first conductivity type and of the same doping level, said wells formed in a common substrate of a second conductivity type, said bipolar integrated circuit comprising:

(a) said first transistor including
 (i) a first base region of said first conductivity formed in said first well,
 (ii) a first emitter region of said second conductivity formed in said first base region, said first emitter region having a first surface area on said substrate, and
 (iii) a first collector region comprising said first well; and (b) said second transistor including
 (i) interconnected second and third base regions of said first conductivity formed in said second well, said second base region having the same doping level as said first base region,
 (ii) interconnected second and third emitter regions of said second conductivity formed in said second and third base regions, respectively, said second emitter region having a second surface area on said substrate equal to said first surface area and said third emitter region having a surface area on said substrate k times said first surface area, said second transistor device formed to have a current gain equal to $1/(k+1)$ times a current gain of said first transistor, and
 (iii) a common collector region comprising said second well region.

18. The bipolar integrated circuit according to claim 17 further comprising first and second buried layers formed in the bottoms of said first and second wells, respectively.

19. A bipolar integrated circuit having first and second transistor devices formed in respective first and second wells of a first conductivity type and of the same doping level, said wells formed in a common substrate of a second conductivity type, said bipolar integrated circuit comprising:

said first transistor including
 (i) a first base region of said first conductivity formed in said first well,
 (ii) a first emitter region of said second conductivity formed in said first base region, Said first emitter region having a first surface area on said substrate, and
 (iii) a first collector region comprising said first well; and said second transistor including
 (i) interconnected second and third base regions of said first conductivity formed in said second well, said second base region having the same doping level as said first base region,
 (iii) interconnected second and third emitter regions of said second conductivity formed in said second and third base regions, respectively, said second emitter region having said first surface area on said substrate and said third emitter region having a surface area on said substrate k times said first surface area where k is a real number, said second transistor device formed to have a current gain equal to $1/(k+1)$ times a current gain of said first transistor, and (iii) a common collector region comprising said second well region, wherein said third base region has an impurity doping level higher than said doping level of said first and second base regions; and said first, second and third emitter regions have substantially equal impurity doping levels.

20. The bipolar integrated circuit according to claim 17 wherein said second and third base regions are immediately adjacent in said second well.

* * * * *